(12) United States Patent
Lin

(10) Patent No.: US 6,639,396 B2
(45) Date of Patent: Oct. 28, 2003

(54) DETECTING STRUCTURE FORMED ON A PCB TO DETECT UNAVAILABILITY OF THE LINES

(75) Inventor: Ching-Chin Lin, Taoyuan Hsien (TW)

(73) Assignee: Compeq Manufacturing Company Limited, Taoyua Hsien (TW)

( * ) Notice: Subject to any disclaimer, the term of this patent is extended or adjusted under 35 U.S.C. 154(b) by 189 days.

(21) Appl. No.: 09/964,165

(22) Filed: Sep. 26, 2001

(65) Prior Publication Data

US 2003/0057982 A1 Mar. 27, 2003

(51) Int. Cl.[7] ............................................. G01R 31/02
(52) U.S. Cl. ..................... 324/158.1; 324/754; 324/763
(58) Field of Search .................... 324/763, 754, 324/765, 755, 761, 72.5, 158.1; 361/751, 777, 403, 414; 174/255, 250, 257

(56) References Cited

U.S. PATENT DOCUMENTS

| 4,894,606 A | * | 1/1990 | Paur ........................... 324/73.1 |
| 4,985,675 A | * | 1/1991 | Turudic ....................... 324/766 |
| 5,051,690 A | * | 9/1991 | Maly et al. .................. 324/537 |

* cited by examiner

Primary Examiner—Kamand Cuneo
Assistant Examiner—Jimmy Nguyen
(74) Attorney, Agent, or Firm—Pearne & Gordon LLP

(57) ABSTRACT

A detecting structure formed on the space of circuit unit correctly and easily detects whether the lines of the circuit unit are formed on the correct position, and more particularly to obtain the deviation difference of a position provided to form the lines. The detecting structure is able to be formed on a space of periphery of each circuit unit, thus the detecting result is exactly correct.

8 Claims, 4 Drawing Sheets

DETECTING STRUCTURE FORMED ON A PCB TO DETECT UNAVAILABILITY OF THE LINES

BACKGROUND OF THE INVENTION

1. Field of the Invention

The present invention relates to a structure formed on a printed circuit board (PCB) for detecting unavailable lines of the PCB, and more particularly to a structure that is able to provide detection of the difference of the lines.

2. Description of Related Art

In general, the "Test Coupon" process is used to detect unavailability of lines of the circuit unit of a PCB, that is, the designer is able to control a situation forming the lines by a microsectioning detecting technique.

With reference to FIG. 10, a PCB has a base board (70) and multiple circuit units (71) formed thereon. A first space (701) is prepared on periphery of the base board (70), which is used for retention by machines in manufacturing processes. When forming the circuit units (71) on the PCB, multiple second spaces (711) are respectively prepared on periphery of each circuit unit (71), which is used to separate the adjacent circuit units (71) to become many circuit boards (70) by a Break-away panel technique. The first space (701) of the periphery of the base board (70) is larger than the second spaces (701), thus the "Test Coupon" process is executed on first space (701) of the periphery of the circuit units (71).

With reference to FIG. 11, a detecting structure (72) includes detecting lines and at least one via (not shown) connected multiple detecting lines (not shown). The detecting structure (72) is formed on the first space (701). The detecting lines (not shown) of the detecting structure (72) and the lines (not shown) of the circuit units (71) are formed at the same time on the base board (70). Therefore, the quality of the detecting lines is equal to the quality of the lines of the circuit units (71). After forming the detecting structure (72), detecting the situation of the detecting lines includes the following steps:

Firstly, sawing the detecting lines together with the via (not shown) connected to the detecting lines whereby the connection of the via and the detecting lines is checked. In order to obtain a higher correction of the detecting result, after sawing the detecting lines, multiple grinding processes are executed until the center of the via appears. Therefore, the situation of the detecting lines and via is detected according to observe whether the via is connected to the detecting lines. However, the detecting structure (72) formed on the first space (701) is farther than that formed on the second space (711) of the periphery of the circuit units (71), therefore detecting sawing section of the detecting lines is not able to completely control the situation of the lines of the circuit units (71).

As per the above description, there are many complex processes such as sawing, grinding, etc for detecting the situation of the testing lines and via. Especially, after the sawing process, the sawn section has only one direction. But the unavailable lines are able to be formed in other directions without being sawn, so that the detecting result is not exactly correct. Therefore, if the detecting result is unavailable, the whole circuit units formed on the same base board are useless, and thus the manufacturing cost is unnecessarily high.

To overcome the shortcomings, the present invention provides a detecting structure for a detecting unavailability of the circuits formed on a PCB to mitigate and obviate the aforementioned problems.

SUMMARY OF THE INVENTION

The objective of the present invention is able to provide a structure for detecting the exact unavailable lines of the lines of a PCB, and furthermore, to avoid using complex processes to check whether the lines are formed on the correct position.

Other objects, advantages, and novel features of the invention will become more apparent from the following detailed description when taken in conjunction with the accompanying drawings.

DETAILED DESCRIPTION OF THE PREFERRED EMBODIMENT

Figure 10:
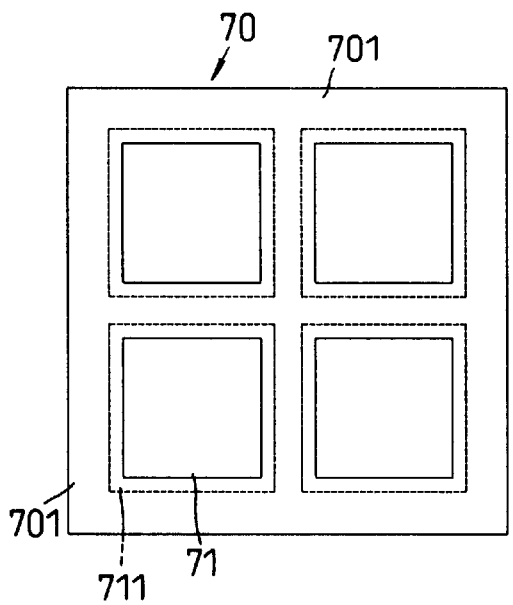
FIG. 10 is a plane view of a conventional PCB.
Figure 1:
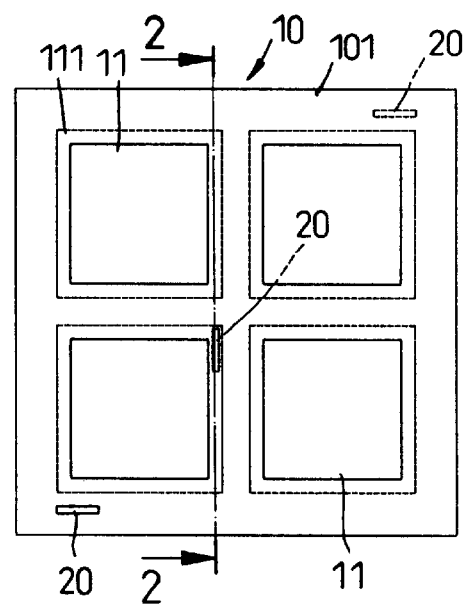
FIG. 1 is a plane of a structure for detecting available of the lines on a PCB in accordance with the present invention.
Figure 11:
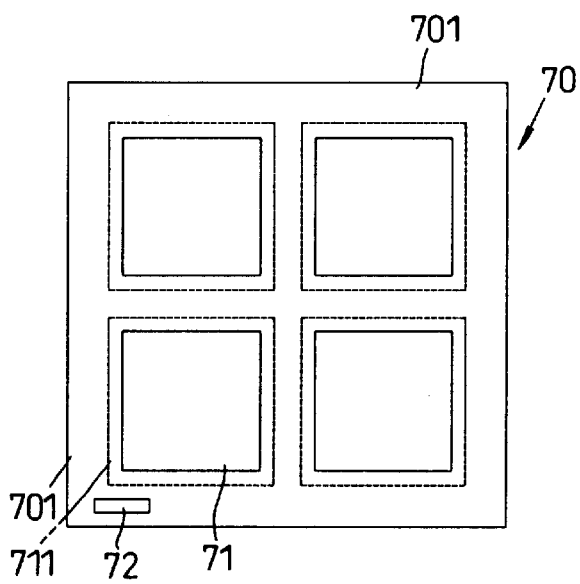
FIG. 11 is a plane view of a structure of the conventional PCB with the Test Coupon process.

In reference to FIG. 1, a PCB has a base board (10), multiple circuit units (11) formed on the base board (10) and at least one detecting structure (20) in accordance with the present invention. A periphery of each circuit unit (11) defines a suitable space (111) for forming the at least one detecting structure (20). The detecting structure (20) is used to observe whether available lines deviate from the correct formed position on the PCB.

Figure 2:
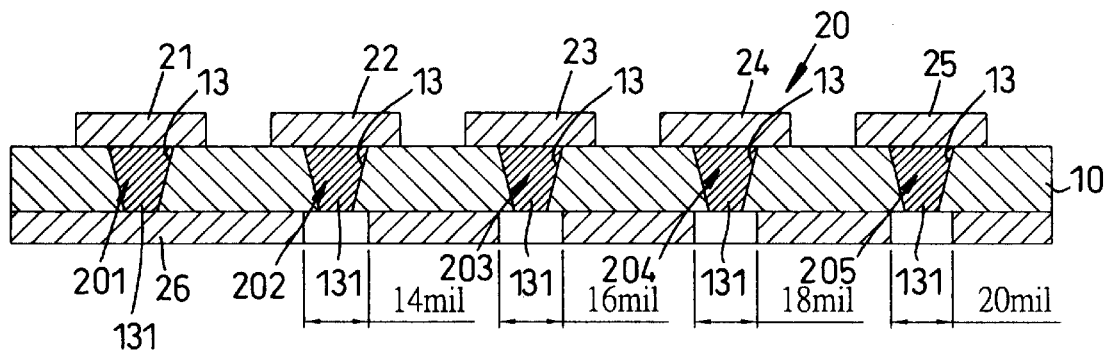
FIG. 2 is a cross section view of the first embodiment of the structure in accordance with the present invention.

With reference to FIG. 2, a first embodiment of the present invention is shown. The detecting structure (20) includes a detecting line (26), a plurality of pads (21)~(25), and a plurality of probes (201)~(205). The detecting line (26) is formed on a bottom surface of the base board (10), and the pads (21)~(25) are formed on an upper surface of the base board (10). Forming the probes (201)~(205), first multiple through holes (13) are defined in the basis board (10) and then the electronic material (131) is filled into the through holes (13) or that is electroplated in the through holes (13). Therefore, each probe (201)~(205) are able to respectively connect electricity to each bottom surface of the pads (21)~(25).

Figure 3:
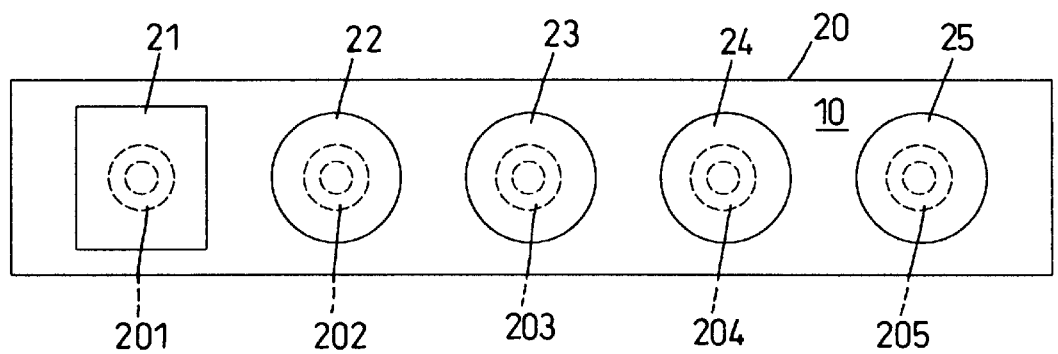
FIG. 3 is a top view of the portion of the structure in accordance with the present invention.

With reference to FIG. 3, the first pad (21) is a rectangular shape, and connects to the detecting line (not shown) by the first probe (201) corresponded with the first pad (21). The shape of the other pads (22)~(25) are circular.

Figure 4:
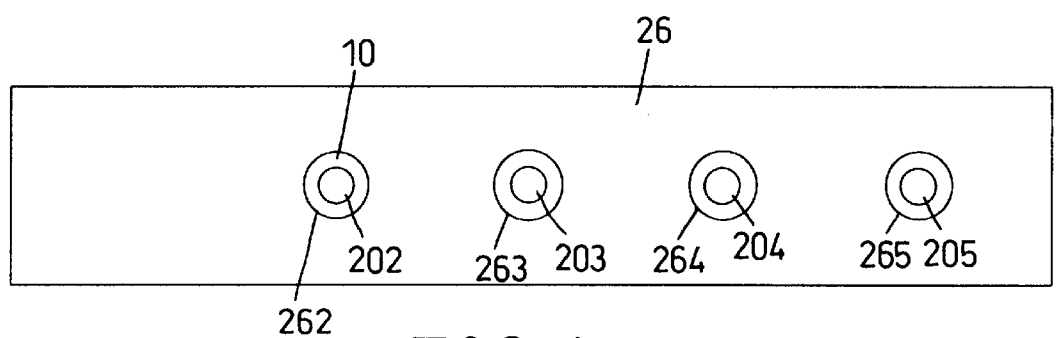
FIG. 4 is a bottom view of the portion of the structure in accordance with the present invention.

With reference to FIG. 4, a multiple windows (262)~(265) are defined on the detecting line (26), and the windows (262)~(265) are circular with different diameters. The windows (262)~(265) respectively correspond to the probes (202)~(205). The diameters of all the windows (262)~(265) are arranged on the detecting line (26) according to increase progressively as 14 mil, 16 mil, 18 mil, and 20 mil, for checking deviation differences of a position which is for forming the detecting line (26).

The probes (202)~(206) correspond to the center of each window (262)~(265). Therefore, except the first probe (201), the probes (202)~(205) do not electrically connect to the detecting line (26).

Figure 5:
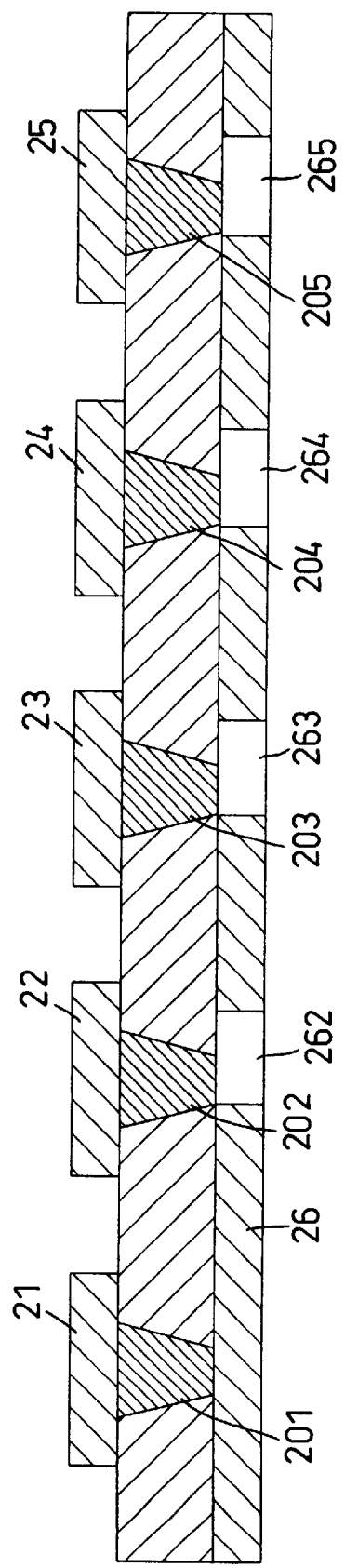
FIG. 5 is a cross section view of the structure in accordance with the present invention.
Figure 6:
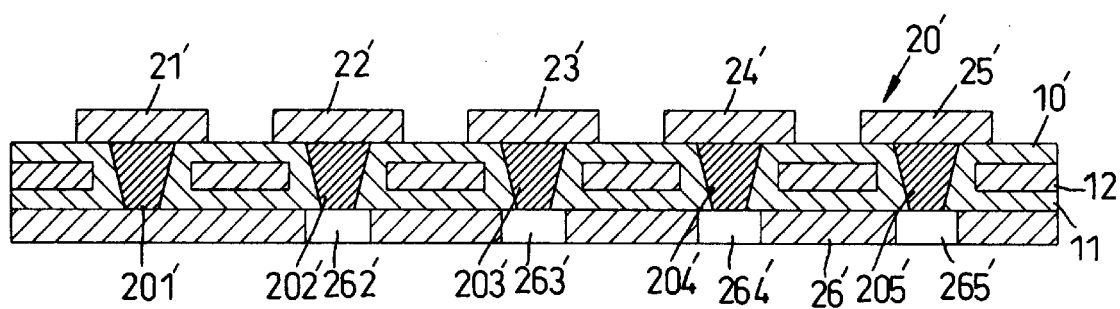
FIG. 6 is a cross section view of the second embodiment of the structure in accordance with the present invention.
Figure 7:
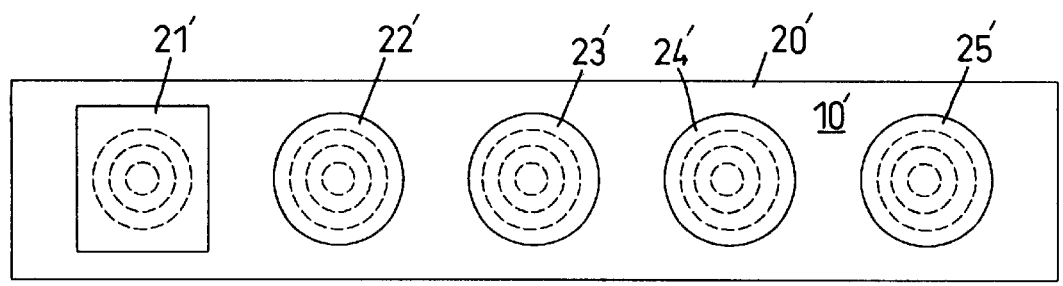
FIG. 7 is top view of the portion of the second embodiment of the structure in accordance with the present invention.

The first probe (201) electrically connects the first pad (21) with the detecting line (26), wherein the pads (21)~(25), the probes (201)~(205), the detecting line (26) and all the lines of the circuit units (11) are formed on the same base board (10) at the same time. Whereby, the characteristic of the detecting line (26) formed on the detecting structure (20) is same as the characteristic of the lines of the circuit units (11). That is to say, availability of the lines of each circuit unit (11) checks whether the first probe (201) connects to the detecting line (26) and whether the other probes (202)~(205) do not connect to the detecting line (26). With reference to the FIG. 5, for example, if a lower diameter of the probes (201)~(205) are 4 mil and the diameter of the window (262)~(265) is at least 14 mil. After the PCB manufacturing processes, if the detecting line (26) formed on the base board (10) has at least 5 mil difference, the probe (202)~(205) connect the pads (22)~(25) with the detecting line (26), that is, the at least 5 mil difference is obtained.

Figure 8:
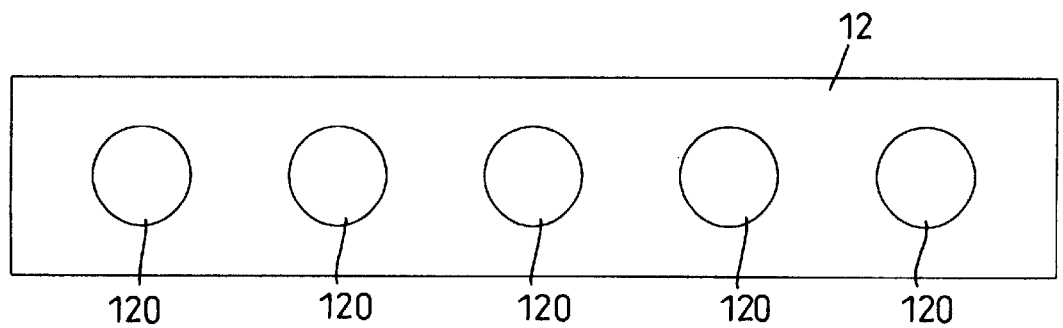
FIG. 8 is bottom view of the portion of the second embodiment of the structure in accordance with the present invention.
Figure 9:
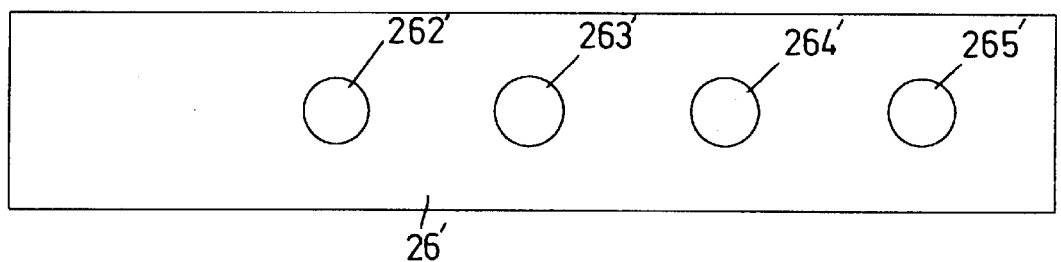
FIG. 9 is a section view of the portion of the second embodiment of the structure in accordance with the present invention.

With reference to FIGS. 6~9, a second embodiment of the PCB is shown wherein the difference between the base board (10') of the first embodiment and the PCB has at least two base boards (10') (11). A line (12) is formed and downwardly corresponded to the detecting line (26') between the base boards (10')(11), and the multiple windows (120) have the same diameters defined on the line (12), as shown in FIG. 8. Each window (120) corresponds to each probe (201')~(205') and some of the window (120) corresponds to each window (262')~(265') of the detecting line (26').

As per the above description, the present invention includes the following advantages:

1. Simplified manufacture processes. Because the detecting line, the probes, the pads and the lines of the circuit units are formed on the base board during the same manufacturing process, the detecting quality of the lines of the circuit units is equal to the detecting structure. That is, testing whether the first probe connects to the detecting line and whether the other lines do not connect to the detecting line forms detecting the quality of the lines of the circuit units. Therefore, the present invention is able to eliminate the sawing and grinding processes.

2. High correction of the detecting result. The detecting line, the probes, and the pads are able to be finely formed on the base board, that is, the detecting structure is small. Whereby, the detecting structure is easily formed on the space of each circuit unit. The circuit units are able to respectively check whether the lines of the circuit board are available.

3. Low manufacture cost. Because the present invention is able to provide the quality of each circuit detecting process, the available circuit units formed on the same base board are saved. Thereby, the manufacture cost is decreased.

Although the present invention has been explained in relation to its preferred embodiment, it is to be understood that many other possible modifications and variations can be made without departing from the spirit and scope of the invention as hereinafter claimed.

What is claimed is:

1. A detecting structure formed on a PCB to detect unavailable lines, wherein the PCB having at least one base board, multiple circuit units having multiple lines formed on the base board and at least one detecting line structure formed on the base board, and the detecting structure comprising:

a detecting line formed on a bottom surface of the base board and multiple different diameter windows defined on the detecting line;

multiple probes formed in the base board, the multiple probes respectively corresponding to one of the windows of the detecting line, wherein in a normal state, the probes respectively disconnects from the detecting line; and multiple pads formed on an upper surface of the base board and which respectively connected to one of the probes; wherein detecting unavailable lines of the PCB is to check whether the probes are electrically connected with the pads and the detecting line.

2. The detecting structure as claimed in claim 1, wherein the diameters of the windows are increased progressively to be formed on the detecting line, to check a deviation difference of a position provided to form the detecting line thereon.

3. The detecting structure as claimed in claim 1, wherein the probes are formed in accordance with the following steps:

defining multiple through holes in the base board; and
filling a electronic material into each through hole.

4. The detecting structure as claimed in claim 1, wherein the probes are formed in accordance with the following steps:

defining multiple through holes in the base board; and
electroplating a electronic material into each through hole.

5. A detecting structure formed on a PCB to detect unavailable lines, wherein the PCB having at least one base board, multiple circuit units having multiple lines formed on the base board and at least one detecting line structure formed on the base board, and the detecting structure comprising:

a detecting line formed on a bottom surface of the base board and multiple different diameter windows defined on the detecting line;

multiple probes formed in the base board, the multiple probes respectively corresponding to one of the windows of the detecting line, wherein a first probe of the probes is connected to the detecting line; and multiple pads formed on a upper surface of the base board and which are respectively corresponded to one of the probes; wherein detecting unavailable lines of the PCB is to check whether the probes are electrically connected the pads and the detecting line beside the first probe.

6. The detecting structure as claimed in claim 5, wherein the diameters of the windows are increased progressively to be formed on the detecting line, to check a deviation difference of a position provided to form the detecting line thereon.

7. The detecting structure as claimed in claim 5, wherein the probes are formed in accordance with the following steps:

defining multiple through holes in the base board; and filling a electronic material into each through hole.

8. The detecting structure as claimed in claim 5, wherein the probes are formed in accordance with the following steps:

defining multiple through holes in the base board; and electroplating a electronic material into each through hole.

* * * * *